United States Patent [19]

Zelenz

[11] Patent Number: 5,157,362
[45] Date of Patent: Oct. 20, 1992

[54] NARROW BAND NOTCH FILTER WITH EXTENDED PASSBAND

[75] Inventor: Martin L. Zelenz, Dewitt, N.Y.

[73] Assignee: Andrew F. Tresness, Syracuse, N.Y.

[21] Appl. No.: 500,111

[22] Filed: Mar. 27, 1990

Related U.S. Application Data

[63] Continuation of Ser. No. 206,527, Jun. 14, 1988, abandoned.

[51] Int. Cl.[5] .............................................. H01P 7/01
[52] U.S. Cl. ..................... 333/175; 333/170; 333/176
[58] Field of Search ............... 333/167, 168, 169, 170, 333/171, 174, 175, 12, 176; 455/1, 286, 339

[56] References Cited

U.S. PATENT DOCUMENTS 2,035,258  3/1936  Bode ..................................... 333/169
4,577,168  3/1986  Hartmann ........................... 333/170

FOREIGN PATENT DOCUMENTS 2425674  12/1975  Fed. Rep. of Germany ...... 333/170
0015044  5/1972   Japan .................................. 333/170
0161515  9/1983   Japan .................................. 333/175
0206914  9/1987   Japan .................................. 333/175

Primary Examiner—Eugene R. LaRoche
Assistant Examiner—Seung Ham
Attorney, Agent, or Firm—Dickinson, Wright, Moon, Van Dusen & Freeman

[57] ABSTRACT

A notch filter having increased pass band characteristics is provided by insertion of an inductor between a normally-grounded capacitor and ground, the capacitor being connected to an inductive-capacitive filter network. By this construction, the equivalent capacitor of the high-frequency equivalent circuit is not connected directly to ground, but rather has the inductor interposed between it and ground. This significantly increases the pass band of the circuit.

2 Claims, 2 Drawing Sheets

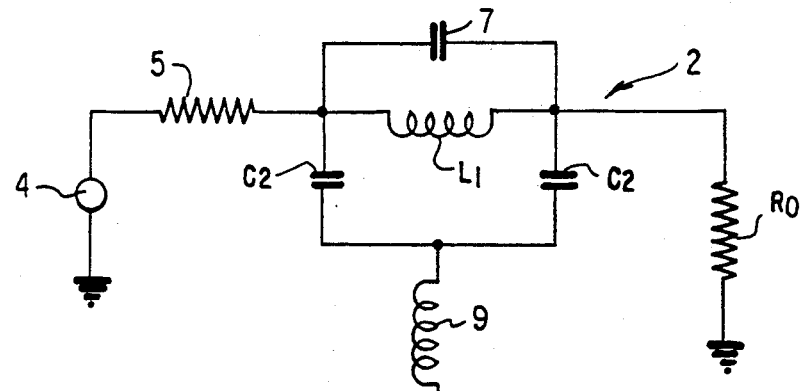
FIG. 1
(PRIOR ART)
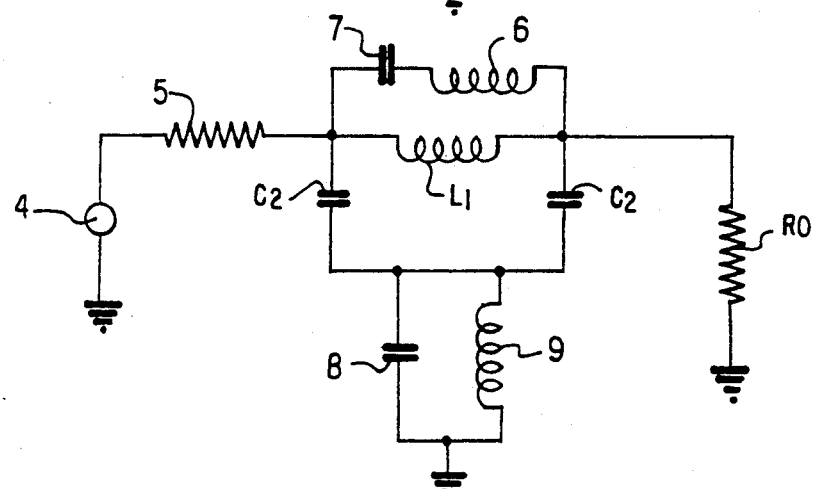
FIG. 2
(PRIOR ART)
FIG. 2A
(PRIOR ART)
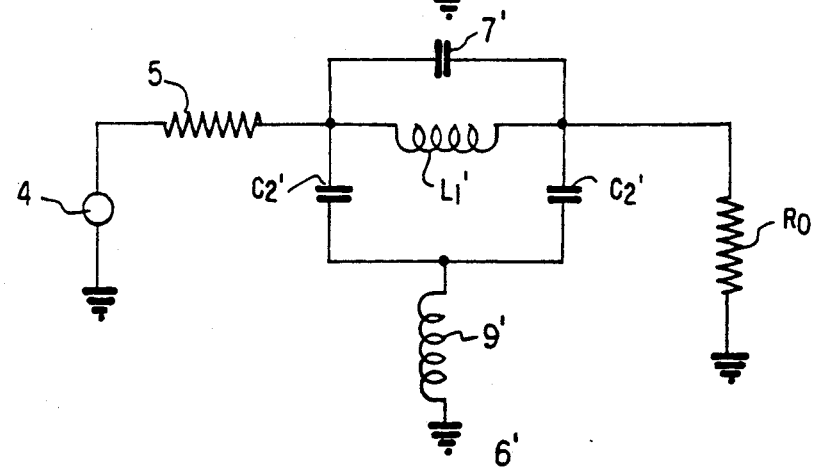
FIG. 3
(PRIOR ART)
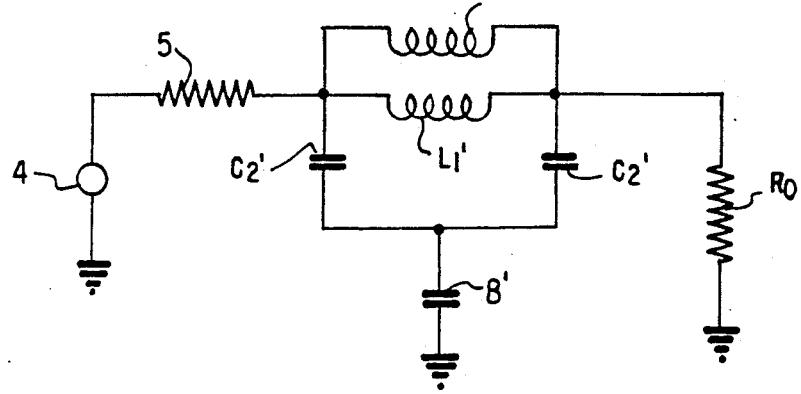

NARROW BAND NOTCH FILTER WITH EXTENDED PASSBAND

This is a continuation of application Ser. No. 07/206,527 which was filed on Jun. 14, 1988, and is now abandoned.

TECHNICAL FIELD

This invention relates to the art of electronic filters. In particular, the invention is a notch filter designed primarily for use in the cable television art.

BACKGROUND ART

It is often necessary in electronic circuits to attenuate a selected band of frequencies while passing a larger band of frequencies. A filter which accomplishes these purposes is commonly known as a notch filter. The use of notch filters in the cable television art is well known. A broad range of carrier frequencies is provided on a cable, each frequency corresponding to a service for which the subscriber pays. If a subscriber does not pay for selected services, it is known to place a notch filter in the coaxial line leading to the subscriber's facility to remove the frequencies corresponding to those services. If several frequencies need to be removed, the filters may be placed in series, or a single filter may be arranged to remove more than one frequency.

The passband of a notch filter is an important characteristic of the filter. With reference to the cable television arts, the passband of a filter must be large enough to accommodate the range of frequencies supplied by the cable television service. Thus, if the high-frequency roll-off of a filter is too great, the attention of the high frequencies makes them unusable. The frequency range of the cable television band was one time 55–300 MHz. The upper range was subsequently raised to 400 MHz, and it has now been raised again to 600 MHz. Accordingly, the passband of notch filters used in this art is critical.

FIG. 1 shows a schematic circuit diagram of a theoretical notch filter. An inductive-capacitive network 2 comprising capacitors C2, inductor L1, and capacitor 7 is placed in series with input signal 4 and input resistor 5 to remove selected frequencies. An inductor 9 couples removed frequencies to ground, and the output appears across output resistor R0. The notch produced by the filter shown in FIG. 1 is generally symmetrical, and this circuit can theoretically achieve an infinitely deep notch if certain conditions are met. The circuit, however, suffers from the undesirable limitation that the component ranges are critical for notch widths less than ten percent of the notch frequency. This makes the circuit shown in FIG. 1 wholly impractical.

FIG. 2 is a schematic diagram of a practical compromise circuit based on the theoretical circuit shown in FIG. 1. In this circuit, an inductor 6 and a capacitor 8 have been added to the network 2. The addition of these components permits the use of practical element values having ranges which are more realistic. FIG. 2a illustrates the equivalent notch performance of the circuit shown in FIG. 2, the component values there being combinations of the values of the components shown in FIG. 2 and being indicated by primed reference numerals.

The circuit shown in FIG. 2 achieved great flexibility in notch filter design, but it suffers from undesirable tradeoffs. FIG. 3 is a high-frequency circuit model of the circuit shown in FIG. 2. Because of the presence of capacitor 8 and inductor 6, added to achieve reasonable component parameters, the maximum pass frequency is limited.

SUMMARY OF THE INVENTION

In accordance with the invention, a markedly increased pass band is achieved in a notch filter by a compound filter network that provides practical flexibility of notch widths and center frequencies and avoids the high frequency roll-off associated with the prior art circuits. Generally, an inductor is placed between a capacitor, such as capacitor 8, and ground to provide a high-frequency residual network which resembles a type III all pass phase shift filter.

The inventive concept may also be applied to other circuits experiencing high-frequency attenuation problems. For example, in circuits experiencing this difficulty, it may be determined that a stray capacitance is effective at high frequencies. After the capacitance has been isolated, an inductor is placed between the capacitance and ground to eliminate the roll-off problem.

An object of this invention is to provide a notch filter having an extended pass band characteristic.

Another object of this invention is to provide a compound filter network having practical flexibility of notch width and center frequency and a large pass band.

BRIEF DESCRIPTION OF THE DRAWINGS

FIG. 1 is a circuit diagram of a theoretical prior art filter.

FIG. 2 is a schematic diagram of a practical modification of the circuit shown in FIG. 1.

FIG. 2a represents equivalent notch performance of the circuit shown in FIG. 2.

FIG. 3 is a high-frequency circuit model of the circuit shown in FIG. 2.

DETAILED DESCRIPTION OF THE PREFERRED EMBODIMENT

Figure 4:
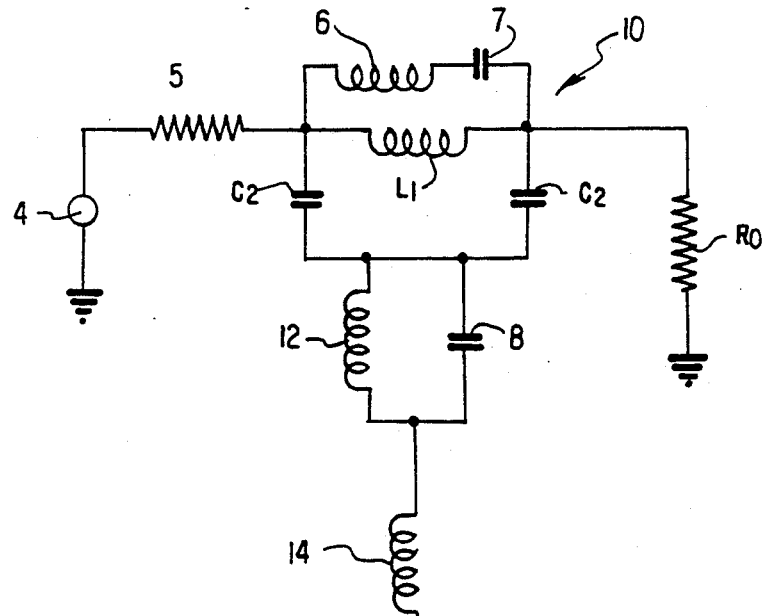
FIG. 4 is a schematic diagram of a circuit in accordance with the invention.

A circuit having a virtually unlimited pass band response in accordance with the invention is shown in FIG. 4. This circuit provides a compound filter network which allows practical flexibility of notch width and center frequency while avoiding the high frequency roll-off associated with the prior art circuits. An input signal 4 is applied to a capacitive-inductive filter network 10. It will be appreciated that network 10 is similar to that shown in FIG. 2 and includes inductor 6 and capacitor 8.

In accordance with the invention, an inductor 14 is connected between the parallel connection of capacitor 8 and inductor 12 and ground. By the addition of inductor 14, the high-frequency residual network of the circuit resembles a type III all pass phase shift filter, as shown in FIG. 5.

Figure 5:
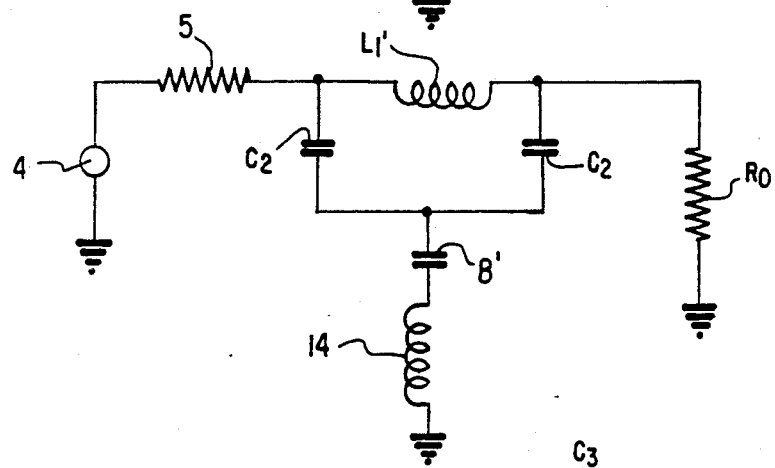
FIG. 5 is a circuit diagram of a high-frequency equivalent of the circuit shown in FIG. 4.

FIG. 5 is also a circuit diagram showing a high frequency equivalent of the circuit of FIG. 4, the equivalent of capacitor 8 and inductor 12 being represented by a capacitor 8'. It will be appreciated that in the prior art, capacitor 8 was connected directly to ground resulting in undesirable high-frequency roll off, whereas in the circuits shown in FIGS. 4 and 5, capacitor 8, or its high-frequency equivalent combination with inductor 12 (8') in FIG. 5 is connected to ground only through inductor 14.

The trap circuit of FIG. 2 permitted independent value selection of the ratio between inductance of inductor 6 and capacitance of capacitor 7 or inductance of inductor 9 and capacitance of capacitor 8. The novel circuit of FIG. 4, however, requires a dependency between the series and shunt branches to achieve a desired all-pass characteristic. The shunt branch constraints may be expressed as:

$$L_{14} = \frac{R_5 C_2}{2}$$

$$C_{8'} = \frac{1}{R_0^2/L_1' - 1/2C_7} \left[ \frac{1 + \frac{L_1}{4R_5^2 C_7}}{1 + \frac{3L_1}{4R_5^2 C_7}} \right]$$

Where:
$L_{14}$ = inductance of inductor 14
$R_5$ = resistance of resistor 5
$C_2$ = twice the capacitance of capacitors C2
$C_{8'}$ = capacitance of effective capacitor 8'
$L_1$ = inductance of inductor L1
$L_1'$ = inductance of inductor L1'
$C_7$ = capacitance of capacitor C7

Figure 6:
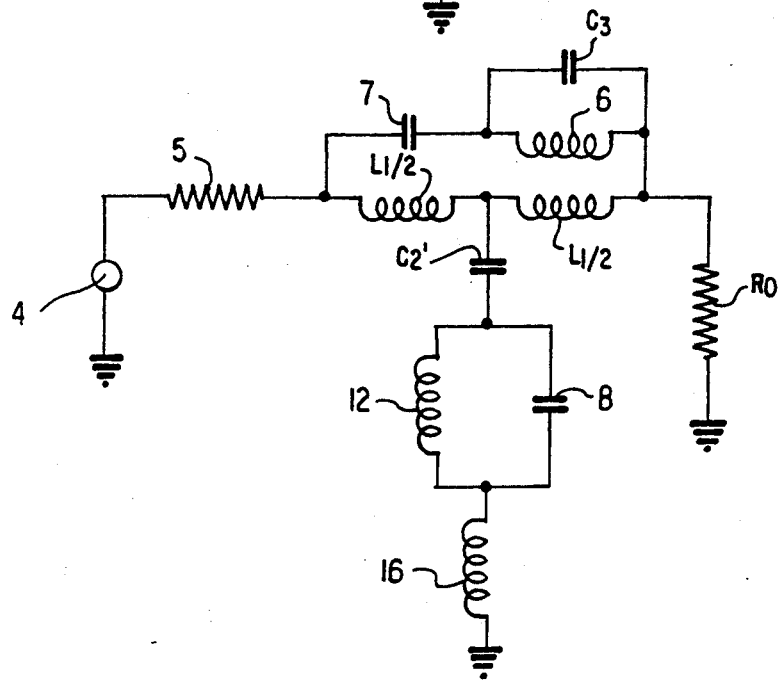
FIG. 6 is a Tee-equivalent circuit showing another application of the invention.

FIG. 6 is a schematic diagram of a Tee-equivalent circuit showing the addition of an inductor 16 in accordance with the invention.

It will be appreciated that a unique circuit having increased pass band characteristics has been described. Modifications within the scope of the appended claims will be apparent to those of skill in the art.

What is claimed is:

1. In a wide band notch filter of the type used to remove cable television frequencies in a pass band above 55 MHz and comprising an input, an output, a network in series with said input and output, said network comprising inductive and capacitive elements operatively coupled to each other, and resonant circuit means formed by a capacitor and inductor in parallel with each other and coupled between said network and ground, the improvement comprising inductive means between said resonant circuit means and ground, the value of said inductive means being such that the high frequency equivalent circuit of said filter resembles an all pass filter and extends said pass band of said filter to at least 600 MHz.

2. A wide band notch filter according to claim 1 wherein the value of said inductive means is such that the high frequency equivalent of said filter resembles a type III all pass filter.

* * * * *